(12) United States Patent
Numata et al.

(10) Patent No.: US 8,253,124 B2
(45) Date of Patent: Aug. 28, 2012

(54) SEMICONDUCTOR ELEMENT

(75) Inventors: Hideaki Numata, Tokyo (JP); Kazuki Ihara, Tokyo (JP)

(73) Assignee: NEC Corporation, Tokyo (JP)

( * ) Notice: Subject to any disclaimer, the term of this patent is extended or adjusted under 35 U.S.C. 154(b) by 183 days.

(21) Appl. No.: 12/676,563

(22) PCT Filed: Apr. 11, 2008

(86) PCT No.: PCT/JP2008/057152
§ 371 (c)(1),
(2), (4) Date: Mar. 4, 2010

(87) PCT Pub. No.: WO2009/031336
PCT Pub. Date: Mar. 12, 2009

(65) Prior Publication Data
US 2010/0252802 A1    Oct. 7, 2010

(30) Foreign Application Priority Data
Sep. 7, 2007 (JP) ................. 2007-232645

(51) Int. Cl.
*H01L 29/06* (2006.01)
(52) U.S. Cl. ............ 257/9; 257/E29.068; 438/149; 977/742
(58) Field of Classification Search ......... 438/149; 257/9, 49–75, 40, E29.068; 977/742
See application file for complete search history.

(56) References Cited

U.S. PATENT DOCUMENTS

| 7,828,619 | B1 * | 11/2010 | Yeh | 445/49 |
| 2002/0061433 | A1 * | 5/2002 | Kawamura et al. | 429/40 |
| 2002/0074947 | A1 * | 6/2002 | Tsukamoto | 315/169.3 |
| 2006/0057743 | A1 * | 3/2006 | Epstein et al. | 438/3 |

FOREIGN PATENT DOCUMENTS

| JP | 2005093472 A | 4/2005 |
| JP | 2007250904 A | 9/2007 |

OTHER PUBLICATIONS

International Search Report for PCT/JP2008/057152 mailed May 13, 2008
E. S. Snow et al., "Random networks of carbon nanotubes as an electronic material", Applied Physics Letters, vol. 82, No. 13, Mar. 31, 2003, pp. 2145-2147.
E. Artukovic et al., "Transparent and Flexible Carbon Nanotube Transistors", Nano Letters, vol. 5, No. 4, 2005, pp. 757-760.
S. Hur et al, "Extreme bendability of single-walled carbon nanotube networks transferred from high-temperature growth substrates to plastic and their use in thin-film transistors", Applied Physics Letters, 86, 243502-1-243502-3, 2005.
T. Takenobu et al., "High-performance transparent flexible transistors using carbon nanotube film", Applied Physics Letters 88, 033511-1-033511-3, 2006.
Y. Zhang et al., "Haterostructures of Single-Walled Carbon Nanotubes and Carbide Nanorods", Science. vol. 285, Sep. 10, 1999, pp. 1719-1722.

* cited by examiner

*Primary Examiner* — Michelle Mandala

(57) ABSTRACT

This invention provides a semiconductor element which uses a plurality of carbon nanotubes as a current path, can reduce contact resistance of its electrode contact part, and has excellent electrical characteristics. This semiconductor element is characterized in that the semiconductor element includes a current path (16) comprised of a plurality of carbon nanotubes (18) and not less than two electrodes (14, 15) connected with the current path, wherein at least one or more of the electrodes is made of a mixture of a metal and a carbon material (17) having $SP^2$ hybridized orbital, such as a multi-walled carbon nanotube, a glassy carbon, and graphite particles.

18 Claims, 6 Drawing Sheets

[Fig.1a]
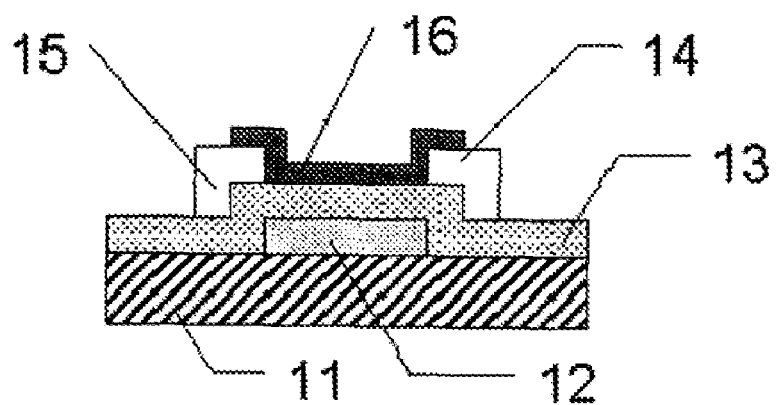
[Fig.1b]
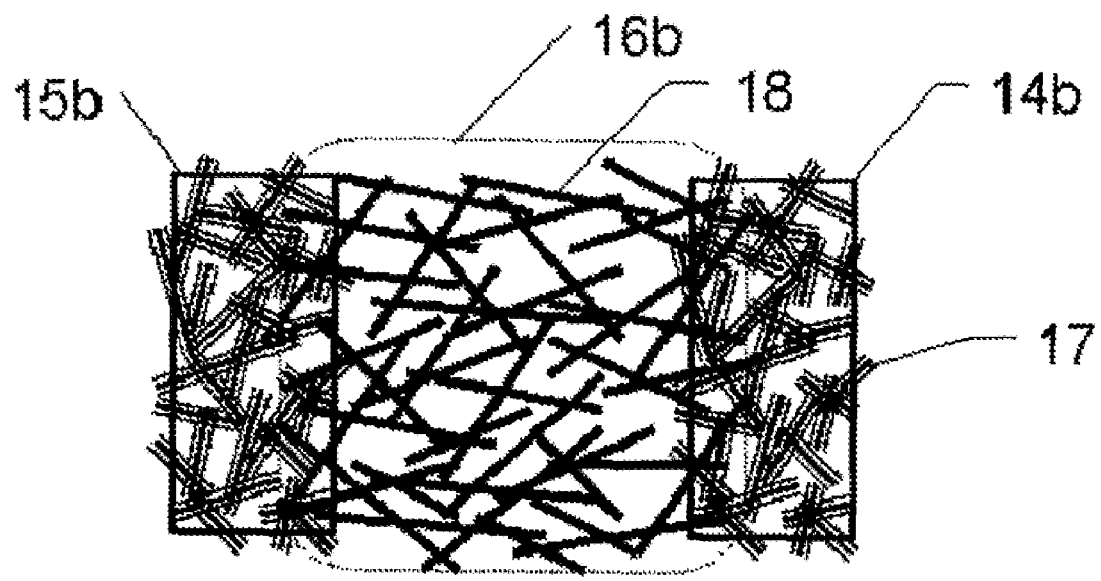

[Fig.2a]
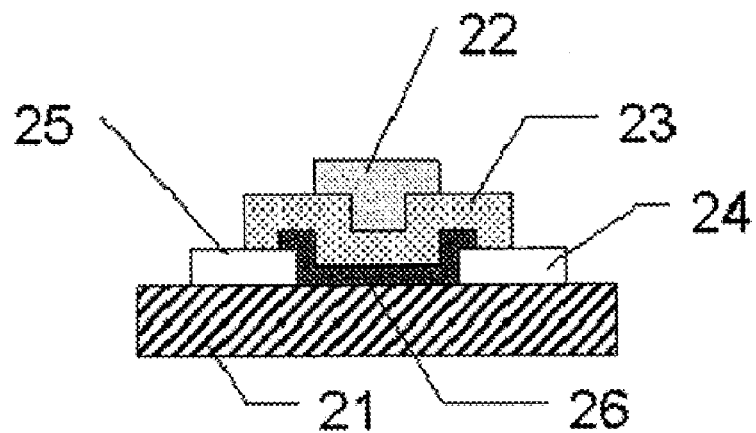
[Fig.2b]
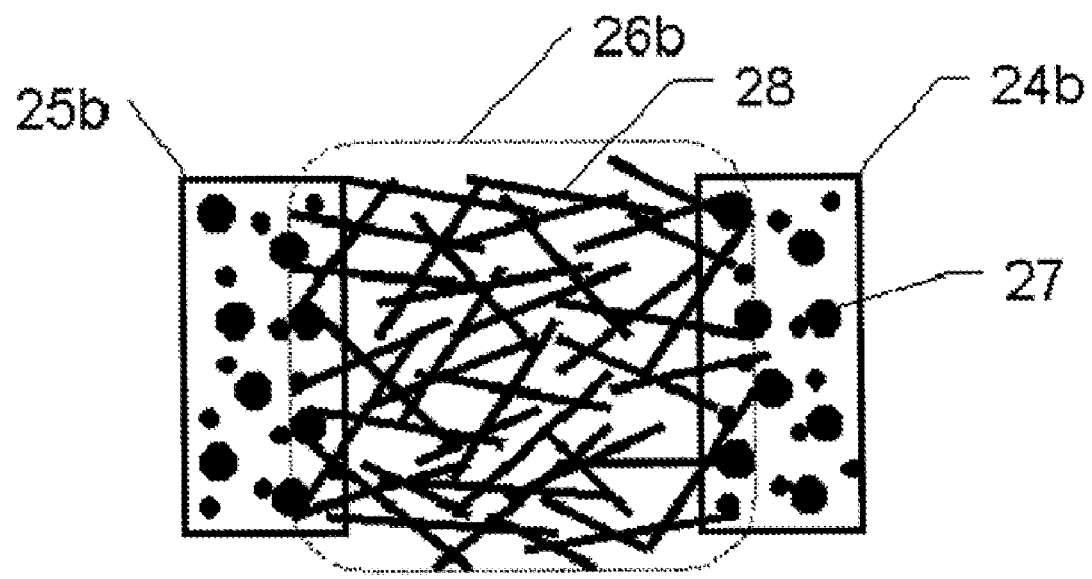

[Fig.3a]
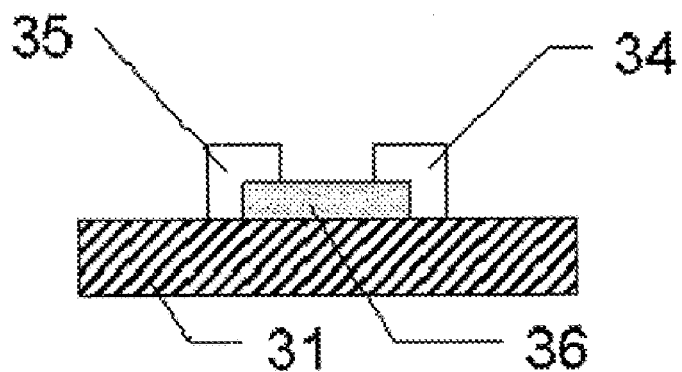
[Fig.3b]
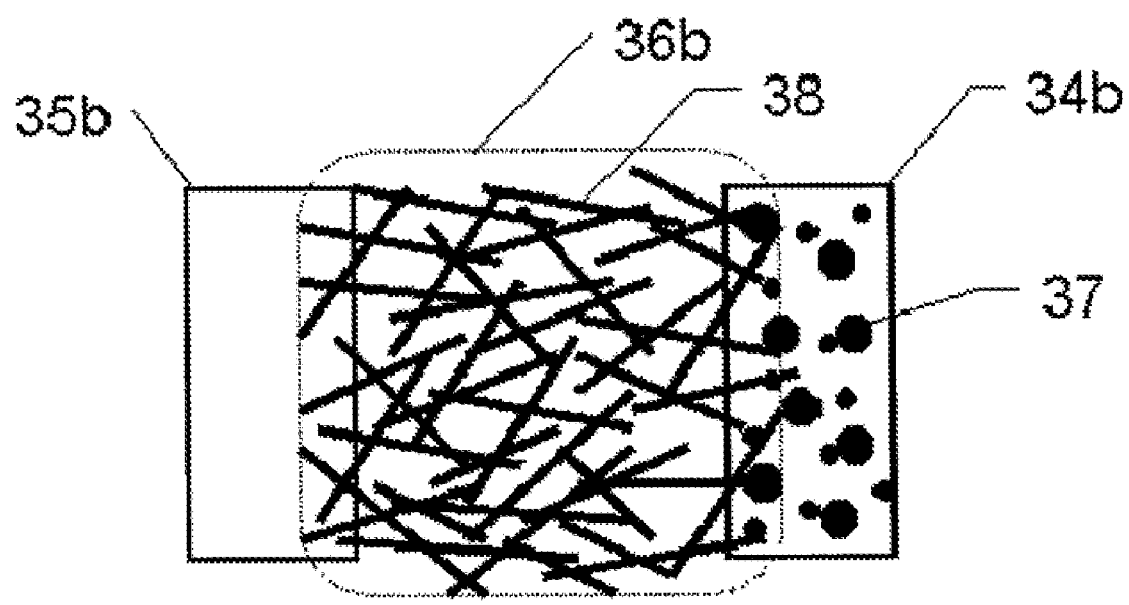

[Fig.4a]
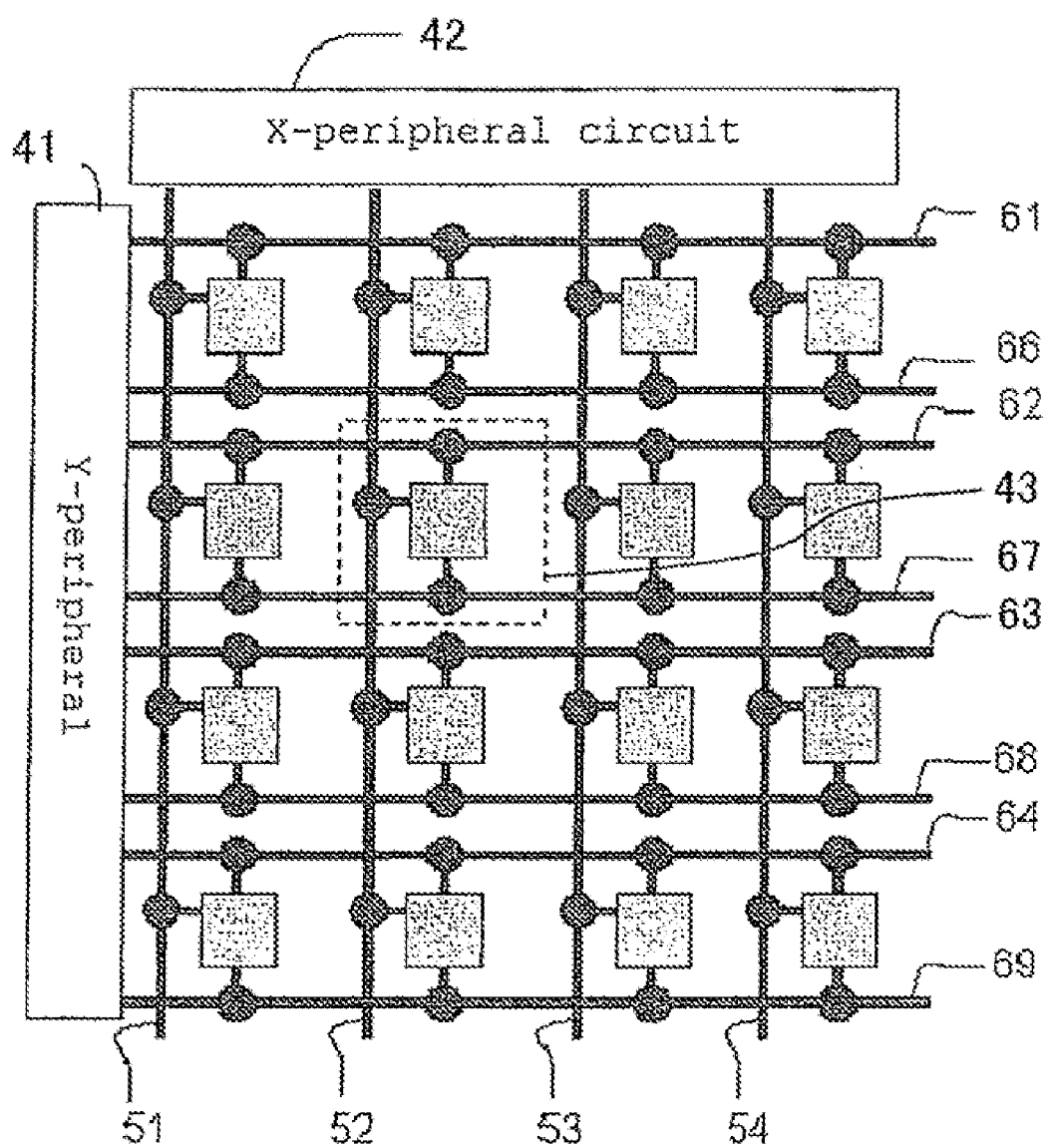

[Fig.4b]
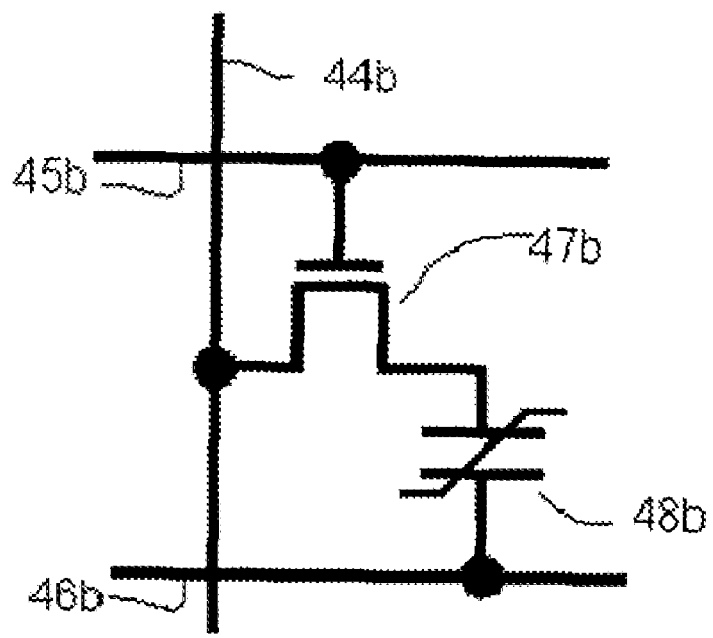
[Fig.4c]
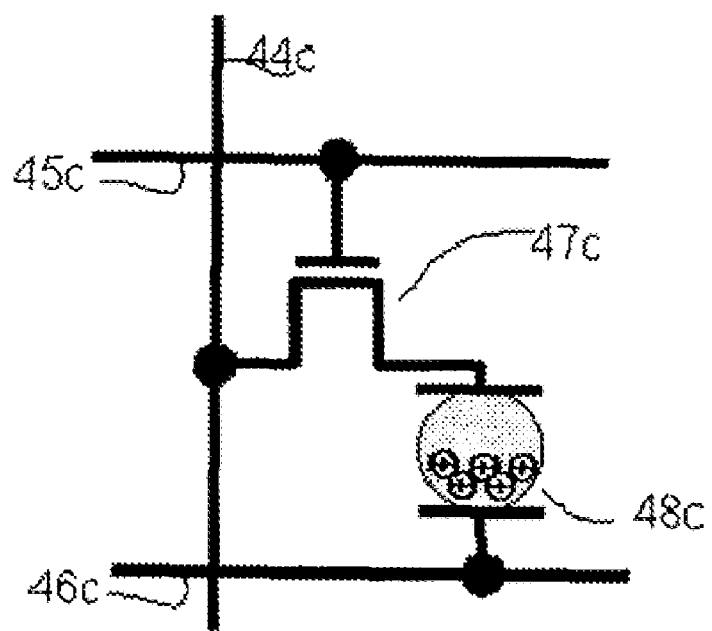

[Fig.4d]
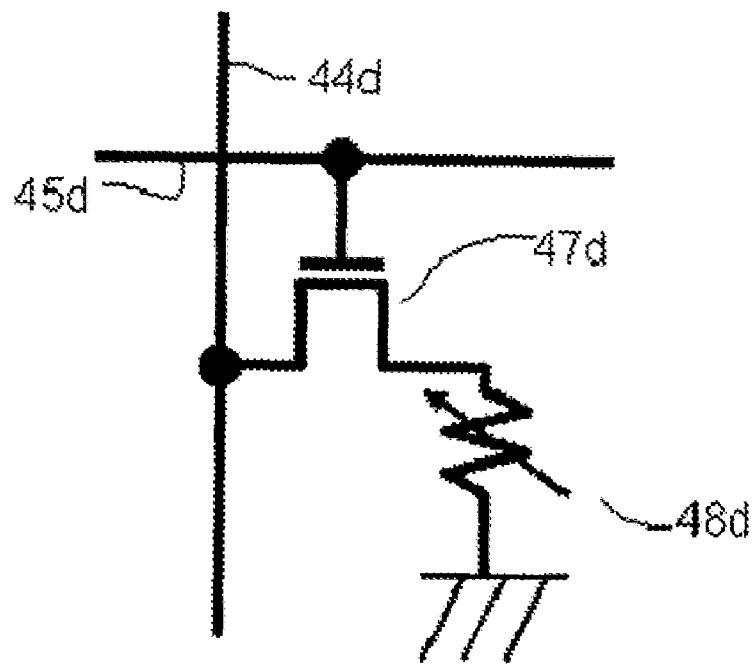
[Fig.4e]
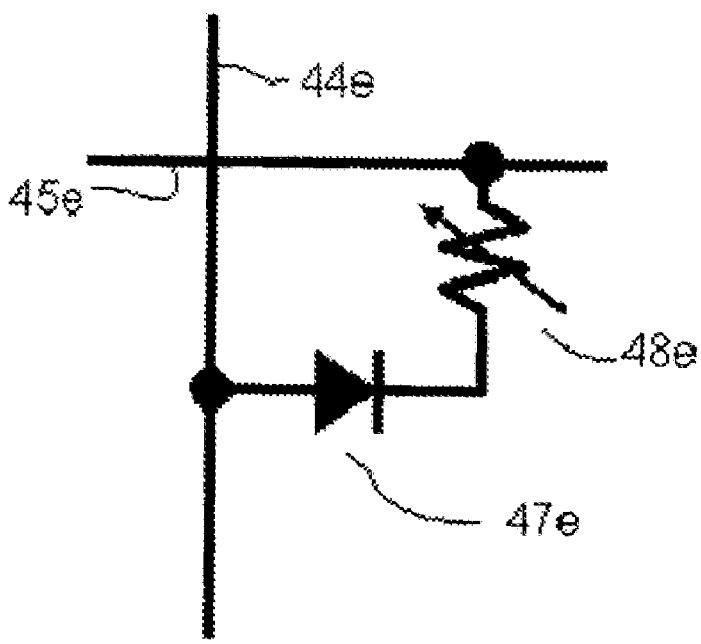

SEMICONDUCTOR ELEMENT

The present application is the National Phase of PCT/JP2008/057152, filed Apr. 11, 2008, which claims the priority based on Japanese Patent Application No. 2007-232645 filed on Sep. 7, 2007, of which disclosure is herein incorporated in its entirety.

TECHNICAL FIELD

The present invention relates to a semiconductor element which utilizes a plurality of carbon nanotubes as a current path, and a semiconductor apparatus which utilizes this semiconductor element.

BACKGROUND ART

Thin film transistors (TFTs) are widely used as a pixel switching element for display apparatuses such as a liquid crystal display and an EL display. Moreover, in recent years, there are a growing number of examples in which the driver circuit of a pixel array is also formed of TFTs on the same substrate. Conventionally, such TFTs used to be fabricated on a glass substrate by using amorphous or polycrystalline silicon. However, a problem exists in that CVD apparatuses which are used for the fabrication of TFTs by use of silicon are very expensive and the area enlargement of a display apparatus etc. which uses TFTs will result in a significant increase in production cost. Moreover, since the process of forming a film of amorphous or polycrystalline silicon is performed at a very high temperature, there are restrictions such as that the materials which can be used as the substrate are limited, and light-weight resin substrates etc. cannot be used.

A carbon nanotube (hereafter, abbreviated as "CNT") is tubular carbon molecules consisting of carbon alone, and has a structure of a rolled-up Graphene sheet made up of six-membered rings of carbon. A CNT which is formed by rolling up a single Graphene sheet into a tubular form is called a "single-walled nanotube" (hereafter, abbreviated as SWNT) and CNTs formed by laminating a plurality of layers of tubular CNTs having different diameters are called a "multi-walled nanotube" (hereinafter, abbreviated as MWNT). The diameter of a SWNT is about 1 nm and that of a MWNT is about several tens of nm. Among CNTs, depending on the difference in the direction of rolling up the Graphene sheet, that is, the difference in the orientation of the six-membered rings of carbon atoms with respect to the circumferential direction, other than the difference in diameter, there are various CNTs of different chiralities such as, for example, a spiral CNT, a zigzag CNT, or an armchair-type CNT. Both metallic and semiconductive properties manifest in SWNTs due to the difference in chirality.

By growing SWNTs having features as describe above randomly between a source and drain electrodes by, for example, a chemical vapor deposition (CVD) method, it is possible to fabricate a field-effect transistor of which channel layer is comprised of SWNTs. Further, this channel layer comprised of SWNTs can also be formed by dispersing CNTs in a liquid, and coating-depositing, and printing them on a substrate.

Non-Patent Document 1 reports that in a thus-formed random network of CNTs, many contacts are formed and connections among carbon nanotubes take place, which can be utilized for the channel layer of a thin film transistor. According to above-described Non-Patent Document 1, when the density of single-walled carbon nanotube in the channel layer is around $1/\mu m^2$, it is possible to obtain an on/off ratio of 5 orders of magnitude and a mobility of 7 $cm^2/Vs$, and fabricate a good thin film transistor.

A random network of CNTs can be obtained by coating or printing a dispersion of CNT as described above. This process can realize device area enlargement at low cost, and has a low process temperature thus contributing less restriction on the selection of materials to be used as the substrate. Therefore, compared with a silicon-based TFT formed on a glass substrate which has been conventionally used, it is possible to significantly suppress the production cost. In recent years, there are frequent reports on TFTs which use random networks of CNT and, for example, there are reports of Non-Patent Documents 2 to 4.

Non-Patent Document 1: E. S. Snow et al., Applied Physics Letters, vol. 82, p. 2145, (2003).
Non-Patent Document 2: E. Artukovic, M. Kaempgen, D. S. Hecht, S. Roth, G. Gruner, Nano Letters vol. 5, p. 757, (2005).
Non-Patent Document 3: S.-H. Hur, 0.0. Park, J. A. Rogers, Applied Physics Letters, vol. 86, p. 243502 (2005).
Non-Patent Document 4: T. Takenobu, T. Takahashi, T. Kanbara, K. Tsukagoshi, Y. Aoyagi, Y. Iwasa, Applied Physics Letters, vol. 88, p. 33511, (2006).

DISCLOSURE OF THE INVENTION

Problems to be Solved by the Invention

In general, in order to improve the electric characteristics of a MOS-type field-effect transistor, it becomes necessary to improve the electric characteristics of the channel layer, to improve the characteristics of gate insulation film, and to reduce the electric resistance of the interface between the channel layer and the source and drain electrodes. In particular, to improve the characteristics of TFTs in which a random network of CNTs are used for the channel layer, the reduction of the electric resistance of the interface between the channel layer and the source and drain electrodes is a critical issue.

Here, because of its minute size, a CNT has a small contact area with a metal electrode. Further, any mismatch between the electronic states of CNT and electrode metal will result in a Schottky barrier at the interface. Due to these factors, a TFT which uses a random network of CNTs for the channel layer has not acquired an on-state current and an ON/OFF ratio which are essentially expected therefor.

Regarding that problem, Non-Patent Document 5 describes a method of reducing the contact resistance by forming a metallic carbide region in the interface between CNT and metal. However, since carrying out the carbide formation of metal through a solid phase reaction requires a very high temperature, there are many restrictions on the material and process for fabricating the element, and the structure of the element.

The present invention addresses the problems of the above described related art. That is, an object of the present invention is to reduce the contact resistance of the interface between the CNT and the electrode interface thereby improving the electric characteristics of the semiconductor element of which current path is comprised of a random network of CNTs. Further, another object of the present invention is to provide a semiconductor apparatus including as its element the semiconductor element of which current path is comprised of a random network of CNTs with improved electric characteristics.

Non-Patent Document 5: Y. Zhang, T. Ichihashi, E. Landree, F. Nihey, S. Iijima, Science vol. 285, p. 1719 (1999).

Means for Solving the Problems

The semiconductor element of the present invention is a semiconductor element, characterized in that the semiconductor element comprises:
a current path comprised of a plurality of carbon nanotubes; and
not less than two electrodes connected with the current path, and in that
at least one or more of the electrodes are made of a mixture of metal and a carbon material having $SP^2$ hybridized orbital.

The semiconductor element of the present invention is a semiconductor element, characterized in that the semiconductor element comprises:
a current path comprised of a plurality of carbon nanotubes; and
not less than two electrodes connected with the current path, and in that
at least one or more of the electrodes are made of a mixture of a metal, a carbon material having $SP^2$ orbital, and a resin.

The carbon material having $SP^2$ hybridized orbital to be mixed in the electrode of the semiconductor element of the present invention specifically includes a multi-walled carbon nanotube, a carbon nanohorn, a graphene, a glassy carbon, graphite particles, a fullerene, etc.

Moreover, the semiconductor element of the present invention is characterized in that
a current path comprised of a plurality of carbon nanotubes is formed by a coating or printing process of a carbon nanotube dispersion, and a drying process of the dispersion.

Moreover, the semiconductor element of the present invention is characterized in that
an electrode which is connected with the current path comprised of a plurality of carbon nanotubes is formed by a coating or printing process, and a drying and sintering processes.

Advantages of the Invention

According to the present invention, it is possible to reduce the contact resistance at the interface between the CNT and the electrode and to improve the electric characteristics of the semiconductor element of which current path is a random network of CNTs. Moreover, the semiconductor element according to the present invention can use a production method which is low cost and suitable for area enlargement, such as a printing method. Therefore, by using the semiconductor element of the present invention, it is possible to provide at low cost a semiconductor apparatus including an element of a semiconductor element of which current path is a random network of CNTs with improved electric characteristics.

BRIEF DESCRIPTION OF THE DRAWINGS

FIG. 1a is a schematic sectional view of a field-effect transistor which is a first exemplary embodiment of the present invention and in which a random network of CNTs is used for a channel layer;
FIG. 1b is an enlarged plan view of parts of the channel layer and a source/drain electrode of the field-effect transistor shown in FIG. 1a;
FIG. 2a is a schematic sectional view of a field-effect transistor which is a second exemplary embodiment of the present invention and in which a random network of CNTs is used for a channel layer;
FIG. 2b is an enlarged plan view of parts of the channel layer and a source/drain electrode of the field-effect transistor shown in FIG. 2a;
FIG. 3a is a schematic sectional view of a Schottky diode which is a third exemplary embodiment of the present invention and in which a random network of CNTs is used for a semiconductor layer;
FIG. 3b is an enlarged plan view of parts of the semiconductor and an electrode of the Schottky diode shown in FIG. 3a;
FIG. 4a shows an example of a semiconductor apparatus which is fabricated by using a plurality of semiconductor elements of the present invention;
FIG. 4b shows the configuration of a basic cell of a ferroelectric memory as a first example of the basic cell which makes up the semiconductor apparatus shown in FIG. 4a;
FIG. 4c shows the configuration of a basic cell of a display apparatus as a second example of the basic cell which makes up the semiconductor apparatus shown in FIG. 4a;
FIG. 4d shows the configuration of a basic cell of a sensor array apparatus as a third example of the basic cell which makes up the semiconductor apparatus shown in FIG. 4a; and
FIG. 4e shows the configuration of a basic cell of a sensor array apparatus which utilizes a diode as a fourth example of the basic cell which makes up the semiconductor apparatus shown in FIG. 4a.

DESCRIPTION OF SYMBOLS

11: Supporting substrate
12: Gate electrode
13: Gate insulation film
14: Source electrode
14b: Source electrode
15: Drain electrode
15b: Drain electrode
16: Channel layer
16b: Channel layer
17: Multi-walled carbon nanotube
18: Single-walled nanotube
21: Supporting substrate
22: Gate electrode
23: Gate insulation film
24: Source electrode
24b: Source electrode
25: Drain electrode
25b: Drain electrode
26: Channel layer
26b: Channel layer
27: Glassy carbon particle
28: Single-walled nanotube
31: Supporting substrate
34: First electrode
34b: First electrode
35: Second electrode
35b: Second electrode
36: Semiconductor layer
36b: Semiconductor layer
37: Graphite particle
38: Single-walled nanotube
41: X-peripheral circuit
42: Y-peripheral circuit
43: Basic cell 44b: Bit line
44c: Bit line
44d: Bit line
44e: Bit line
45b: Word line
45c: Word line
45d: Word line
45e: Word line
46b: Plate line
46c: Plate line
46d: Plate line
47b: Field-effect transistor
47c: Field-effect transistor
47d: Field-effect transistor
47e: Diode
48b: Ferroelectric capacitor
48c: Electrophoretic microcapsule
48d: Variable resistance
48e: Variable resistance
51 to 54: Bit line
61 to 64: Word line
66 to 69: Plate line

BEST MODE FOR CARRYING OUT THE INVENTION

The Schottky barrier is caused by an occurrence of a depletion layer at an interface of a semiconductor as a result of that due to a difference in the work function or the ionization energy between a metal and a semiconductor, carriers near the interface in the semiconductor movers to the metal. In order to decrease the contact resistance of semiconductor/metal interface caused by a Schottky barrier, there are primarily following two methods.

The first is a method of decreasing the height of the energy barrier of a Schottky barrier, which is to be generated, by making the work functions (ionization potentials) of two materials, which are made to contact with each other, as uniform as possible. For example, for making a contact with a p-type semiconductor, gold, platinum, or nickel etc. which has a large work function is suitable. On the contrary, to make a contact with an n-type semiconductor, silver, aluminum, titanium, or chromium which has a small work function is suitable.

The second is a method of decreasing the thickness of a depletion layer, which is to be generated at an interface of semiconductor, by increasing the carrier density of the semiconductor which is to be contacted with. As the thickness of the depletion layer decreases, the tunneling probability of the carrier increases even if a Schottky barrier takes place, making it possible to decrease the contact resistance. In a silicon-based CMOS, generally, a high concentration p-doped region is provided in a contact part of a p-channel, and a high concentration n-doped region in a contact part of an n-channel, respectively so that the contact resistance with metal is reduced.

In materials made up of six-membered rings of carbon atom, such as graphite and graphene sheet, pi-electrons by $SP^2$ hybridized orbital contributes to electrical conduction. The electron states of these substances are determined by the periodicity of a six-membered ring of carbon, to be zero-gap semiconductors. Therefore, a large number of carriers are excited at a room temperature. On the other hand, as described above, a CNT is tubular carbon molecules consisting of carbon alone, and has a structure in the form of a rolled-up graphene sheet made up of six-membered rings of carbon atom. The electronic state of a CNT is determined by a periodic boundary condition of the circumference in addition to the periodicity of the above-described six-membered ring of carbon. A SWNT having an appropriate chirality produces a gap in the electronic energy band to become a semiconductor. In this way, the electronic states of carbon materials such as graphite and graphene sheet, and a semiconductor SWNT are based on the periodicity of the six-membered ring of carbon and are very similar to each other. Therefore, at a contact interface between a semiconductor SWNT and a graphene sheet, Schottky barriers which are seen at an interface between a semiconductor SWNT and a metal are not likely to occur, and therefore the contact resistance is low. Further, in the case of carbon materials such as a graphene sheet, since a large number of carriers are excited at room temperature, the thickness of a depletion layer generated at a contact interface with a metal will be reduced, resulting in an increased tunneling probability and a reduced contact resistance. These actions are similar to those in a high concentration dope region of a contact portion in a silicon-based CMOS. Therefore, when connecting a semiconductor SWNT with a metal electrode, by adopting a configuration such as a semiconductor SWNT/graphene sheet/metal, it is possible to significantly reduce the contact resistance caused by a Schottky barrier at a connection part between a semiconductor SWNT and a metal.

The structure of metal/high concentration doped region/channel in a CMOS-owes much to the development of the miniaturization process technologies of photolithography and ion implantation. However, there is no process technology to selectively form a carbon material such as a graphite and a graphene sheet for the current path comprised of a plurality of semiconductor SWNTs. In the semiconductor element of the present invention, for a current path comprised of a plurality of semiconductor SWNTs, by adopting a structure in which an electric contact is made by an electrode made of a mixture of a metal and a carbon material such as fragments of graphene sheet, it becomes possible to easily form the above-described configuration of SWNT/graphene sheet/metal. The portion which forms such configuration is probabilistic depending on the mixing proportion of the fragments of graphene sheet and the contact area. However, even such a probabilistic incidence can provide a practically sufficient advantage, because in comparison with a typical direct contact such as SWNT/metal, the reduction of contact resistance has large effects, and the electric resistance is determined by the minimum value of the resistance of the current path.

Here, there are two features which are required of the carbon material to be mixed into the electrode metal in order to reduce the contact resistance caused by the Schottky barrier at a connection part between a semiconductor SWNT and a metal. The first feature is that the material has a periodicity of six-membered rings of carbon. The second feature is that a large number of carriers are excited at room temperature. Specific examples of such material include: a graphite, a glassy carbon, a carbon nanohorn, a multi-walled carbon nanotube, and a fullerene other than a graphene sheet. Equally similar effects can be obtained by these materials.

Moreover, the electrode made of a mixture of a metal and the above-described fragments of carbon material can be formed in various methods. For example, first, a dispersion in which the above-described fragments of carbon material are mixed and dispersed in a colloidal solution of silver or gold nano-particles is prepared as an ink or paste. Next, an electrode pattern is drawn by use of a printing/coating apparatus such as an inkjet printer or a dispenser. Next, the pattern is dried and thereafter is subjected to heat treatment to sinter and melt the metal. The metal nano-particles has a high surface activity and therefore can be sintered and melted at a significantly lower temperature compared with a bulk metal.

In this way, it is possible to form such an electrode even on a plastic substrate. Moreover, the apparatus used in a printing method is generally low cost compared with the apparatus used in a vacuum process. Particularly, it has a large effect for device area enlargement. Thus, the semiconductor element of the present invention can be easily applied to large-area, inexpensive semiconductor apparatuses, making it possible to produce large-scale display apparatuses, sensor arrays, and the like at low cost.

For the metal to be used for the electrode material of the present invention, any material which is known as known electrode materials can be used. However, when the carrier of the semiconductor element of interest is an electron, it is desirable that elements which have smaller work function such as silver, aluminum, titanium, tantalum, chromium, tungsten, etc. are contained. On the contrary, when the carrier of the semiconductor element of interest is a hole, it is desirable that elements which have larger work function such as gold, platinum, iridium, palladium, cobalt, nickel, etc. are included. Since including such metal elements can make the work function/ionization potential of the metal and the mixed carbon material uniform at the interface between the two, it is possible to further reduce the contact resistance.

Moreover, when the electrode of the semiconductor element of the present invention is fabricated by a printing method, it is also effective to use an ink to which a resin is further admixed in addition to the metal nano-particles and the fragments of carbon material. Such resin additives are generally called as a binder. Addition of a binder resin improves the mechanical strength of electrodes formed and the adhesive force to the foundation. Further, the adhesion of the binder resin allows the process temperature to be kept low even when a high melting point metal material or the like is used.

Hereafter, the configuration of the semiconductor element of the present invention will be described.

EXEMPLARY EMBODIMENT 1

An example of the structure of a semiconductor element of the present invention is shown in FIG. 1. FIG. 1a is a schematic sectional view of a field-effect transistor which is a first exemplary embodiment of the present invention and in which a random network of CNTs is used for a channel layer. FIG. 1b is an enlarged plan view of parts of the channel layer and a source/drain electrode of the field-effect transistor.

A gate electrode 12 is formed on a supporting substrate 11. Further, a gate insulation film 13 is formed so as to cover the gate electrode 12. On the gate insulation film 13, a source electrode 14 and a drain electrode 15 are disposed at a distance corresponding to a channel length apart. Further, a random network of CNTs is disposed as a channel layer 16 so as to be in contact with the gate insulation film 13, the source electrode 14, and the drain electrode 15. The semiconductor element of the present invention is formed by the structure as described above.

The semiconductor element of the present invention is fabricated by, for example, a fabrication method as follows. For example, a desired shape of the gate electrode 12 is drawn and dried on a poly-ethylene naphthalate substrate of 0.2 mm thickness by using, for example, an inkjet printer with silver nano-particles dispersed in a solvent as the ink. Next, a heat treatment at 150° C. is performed to sinter and form the gate electrode 12. Next, an insulator comprised of an organic polymer is coated as a gate insulation film 13 so as to cover the gate electrode 12, and is vitrified at 150° C. The film thickness of this gate insulation film 13 is not specifically limited. However, since when it is too thin, it becomes difficult to effectively restrict a leak current between the gate electrode and another electrode, and when it is too thick, it becomes impossible to effectively control the switching phenomena of the active layer due to a gate bias voltage, a range of 10 to 1000 nm is preferable. When forming the source electrode 14 and the drain electrode 15, first, an ink is prepared in which silver nano-particles, of which surface is stabilized by an organic material, and multi-walled carbon nanotubes are dispersed in a solvent. Next, with this ink, a desired shape of electrode is drawn and dried using for example an inkjet printer. Finally, heat treatment is performed at 150° C. to sinter the electrode. After the electrode is sintered, a CNT ink, in which single-walled nanotubes which show a semiconductive property are dispersed in a solvent, is coated to a predetermined place using a dispenser and dried to fabricate a semiconductor element.

In such fabrication process, the maximum processing temperature is low and many engineering plastics can be used as the material for the supporting substrate 11. Therefore, it is possible to impart added values such as flexibility, transparency, etc., which are unable to be obtained by a conventional silicon-based semiconductor integrated circuit, to the semiconductor apparatus to be produced. Moreover, it is possible to do without an expensive vacuum apparatus, and to suppress the manufacturing cost to a low level. Moreover, although in the present example, an inkjet printer and a dispenser are used as the printing means, it is also possible to use screen printing, relief printing, or offset printing means as well.

FIG. 1b is an enlarged plan view of parts of the channel layer 16, the source electrode 14, and the drain electrode 15 of the semiconductor element of the present invention. The region indicated by 14b in FIG. 1b corresponds to the above-described source electrode 14, and the region indicated by 15b corresponds to the drain electrode 15. These electrodes are made of, for example, a mixture of silver which makes up the matrix, and multi-walled carbon nanotubes 17 which are a good conductor. These electrodes are formed by drawing the electrodes with an ink which is a mixture of silver nano-particles and multi-walled carbon nanotubes and thereafter sintering it at a temperature not lower than the temperature at which the surface of nano silver particle will melt. Therefore, in the formed source electrode 14b and the drain electrode 15b, the multi-walled carbon nanotubes 17 and the matrix silver are in complete adhesion with one another. At an environmental temperature of around room temperature, the carriers in the multi-walled carbon nanotubes 17 are sufficiently excited and the contact resistance is low.

The region indicated by 16b in FIG. 1b corresponds to the above-described channel layer 16. In this channel layer 16b, a plurality of semiconductor single-walled carbon nanotubes 18 are randomly disposed and jointed thereby making up a semiconductor layer as a whole. In the joint/overlap part between the above-described source electrode 14b and the channel layer 16b, and the joint/overlap part between the drain electrode 15b and the channel layer 16b, the above-described source electrode 14b and the above-described multi-walled carbon nanotubes 17 in the drain electrode 15b and the single-nanotubes 18 in the above-described channel layer 16b are in contact at many portions. In these contact portions, exchange of charge carriers is smoothly performed between the band made of $SP^2$ hybridized orbital of the multi-walled carbon nanotubes 17 of the electrodes and the band made of $SP^2$ hybridized orbital of the single-walled nanotubes 18 of the channel layer 16b.

In the semiconductor element of the present invention, carriers move smoothly from silver, through the multi-walled carbon nanotubes, to a plurality of single-walled nanotubes 18 of a semiconductor thereby allowing the contact resistance at electrode parts to be reduced. As a result of that, in the semiconductor element of the present invention, electric characteristics such as an on-state current, an ON/OFF ratio, etc. have improved.

EXEMPLARY EMBODIMENT 2

Further, a second example of the structure of the semiconductor element of the present invention is shown in FIG. 2. FIG. 2a is a schematic sectional view of a field-effect transistor which is a second exemplary embodiment of the present invention and in which a random network of CNTs is used for a channel layer. FIG. 2b is an enlarged plan view of parts of the channel layer and a source/drain electrode of a field-effect transistor.

A source electrode 24 and a drain electrode 25 are disposed at a distance corresponding to the channel length apart on a supporting substrate 21. A random network of CNTs is disposed as a channel layer 26 so as to be in contact with the source electrode 24 and the drain electrode 25. Further, a gate insulation film 23 is formed so as to cover the source electrode 24, the drain electrode 25, and the channel layer 26. Further, on top of that, a gate electrode 22 is formed. The semiconductor element of the second exemplary embodiment of the present invention is comprised of the structure as described above.

This semiconductor element can be fabricated by using a coating/printing method as with the element of the first exemplary embodiment described above. First, an electrode ink is prepared in which gold nano-particles, of which surface is stabilized by an organic substance, glassy carbon particles, and a resin which serves as a binder are dispersed in an appropriate solvent. Next, desired shapes of the source electrode 24 and the drain electrode 25 are drawn and dried on the substrate 11 by use of the ink. Further, a dispersion in which single-walled carbon nanotubes which exhibit a semiconductor property are dispersed in a solvent is coated to a predetermined place by use of a dispenser and is dried so as to form the channel layer 26. Next, a heat treatment is performed at 180° C. to sinter the electrode. During the course of this sintering heat treatment, the binder resin of the electrode ink temporarily softens thereby increasing the adhesion between the source electrode 24 and the drain electrode 25, and the single walled carbon nanotubes. Thereafter, an insulator comprised of a polymeric organic substance is coated as the gate insulation film 23 by an inkjet printer so as to cover the source electrode 24, the drain electrode 25, and the channel layer 26, and is vitrified at 150° C. Finally, a paste including silver particles is printed into a desired pattern of the gate electrode 22 by a screen printing method, and is dried and sintered by heat treatment.

FIG. 2b is an enlarged plan view to show parts of the channel layer 26, the source electrode 24, and the drain electrode 25 of the semiconductor element of the present invention. The region indicated by 24b in FIG. 2b corresponds to the source electrode 24, and the region indicated by 25b corresponds to the drain electrode 25. These electrodes are made of, for example, a mixture of gold which makes up the matrix, glassy carbon particles 27 which are a good conductor, and a binder resin. At the formed source electrode 24b and the drain electrode 25b, the glassy carbon particles 27 and the matrix gold are in complete adhesion with one another. At an environmental temperature of around room temperature, the carriers in the glassy carbon particles 27 are sufficiently excited and the contact resistance is low.

The region indicated by 26b in FIG. 2 corresponds to the above-described channel layer 26. In this channel layer 26b, a plurality of single-walled nanotubes 28, which are a semiconductor, are randomly arranged and jointed to form a single semiconductor layer as a whole. By the heat treatment after the formation of the channel layer 26b, the binder resin in the electrodes softens so that a large number of single-walled nanotubes 28 are taken into the electrodes. As a result of that, at the joint/overlap part between the source electrode 24b and the channel layer 26b, and the joint/overlap part between the drain electrode 25b and the channel layer 26b; the glassy carbon particles 27, which are a good conductor, in the source electrode 24b and the drain electrode 25b, and the single-walled nanotubes 28 are in contact with one another at many portions. This makes it possible that exchange of charge carriers is smoothly conducted between the band made of $SP^2$ hybridized orbital of the glassy carbon particles 27 of the electrodes, which are a good conductor, and the band made of $SP^2$ hybridized orbital of the single-walled nanotubes 28 of the channel layer 26b.

In the semiconductor element of an example of the present invention, carriers move smoothly from gold to a plurality of single-walled nanotubes 28, which are a semiconductor, through the glassy carbon particles 27 thereby allowing the contact resistance at electrode parts to be reduced. As a result of that, electric characteristics such as an on-state current, an ON/OFF ratio, etc. have improved in the semiconductor element of the present invention.

As so far described, the semiconductor element of the present invention can provide a high performance field-effect type transistor including a current path comprised of a plurality of carbon nanotubes. Further, the semiconductor element of the present invention can also provide a high performance rectifier element including a current path comprised of a plurality of carbon nanotubes.

EXEMPLARY EMBODIMENT 3

An example of the structure of the semiconductor element of the present invention is shown in FIG. 3. FIG. 3a is a schematic sectional view to show a diode which is a third exemplary embodiment of the present invention and in which a random network of CNTs is used for the semiconductor layer. FIG. 3b is an enlarged plan view to show parts of the semiconductor layer and the electrodes of the diode.

A random network of CNTs is disposed as a semiconductor layer 36 on a supporting substrate 31. A first electrode 34 is disposed at one end of the semiconductor layer 36. A second electrode 35 is disposed at the other end of the semiconductor layer 36.

The region indicated by 34b of FIG. 3b, which is an enlarged plan view of the semiconductor element of the present invention, corresponds to the first electrode 34, and the region indicated by 35b corresponds to the second electrode 35. The first electrode 34b is formed by, for example, being drawn with an ink of silver nano-particles and sintered. The second electrode 35b is made of, for example, a mixture of gold, which makes up the matrix, and graphite particles 37 which are a good conductor. The second electrode 35b is formed by being drawn with an ink which is a mixture of gold nano-particles and graphite particles 37, and thereafter sintered at a temperature not lower than the temperature at which the surface of the gold nano-particles melts. Therefore, at the formed second electrode 35b, the graphite particles 37 and the matrix gold are in complete adhesion with one another.

The region indicated by 36b in FIG. 3b corresponds to the above-described semiconductor layer 36. In this semiconductor layer 36b, a plurality of single-walled nanotubes 38, which are a semiconductor, are randomly arranged and jointed to form a single semiconductor layer as a whole. Here, for example, single-walled nano-tubes which have a p-type characteristic are used as the material to make up the semiconductor layer 36b.

At the joint/overlap part between the second electrode 35b and the semiconductor layer 36b, the graphite particles 37 in the second electrode 35b are in contact with the single-walled nanotubes 38 of the semiconductor layer 36b at many portions. In these contact portions, carriers moves smoothly from gold to a plurality of single-walled nanotubes 38, which are a p-type semiconductor, through the graphite particles 37, and the contact resistance at the electrode part is low.

On the other hand, in the joint/overlap part between the first electrode 34b and the semiconductor layer 36b, silver which makes up the first electrode 34b and single-walled nanotubes 38, which are a p-type semiconductor, of the semiconductor layer 36b are in contact with one another. The work function of silver is lower relative to the ionization potential of a p-type single-walled nanotube, and a Schottky barrier is formed at this interface.

In a semiconductor element including a current path which is comprised of a conventional plurality of carbon nanotubes, such Schottky barriers are formed both at the first electrode 34b and the second electrode 35b thereby significantly reducing the performance of semiconductor. However, in the semiconductor of the present invention, as with the third exemplary embodiment, it is made possible to form a Schottky barrier only at a specified connection part, thereby providing a semiconductor element which is imparted with a Schottky-type rectifying function.

EXEMPLARY EMBODIMENT 4

Next, an example of the semiconductor apparatus which is fabricated by using a plurality of semiconductor elements of the present invention is shown in FIG. 4. FIG. 4a shows examples of the connection arrangement of this semiconductor apparatus. FIGS. 4b to 4e shows examples of the basic cell which makes up the semiconductor apparatus.

This semiconductor apparatus includes a plurality of bit lines 51 to 54, a plurality of word lines 61 to 64 which are perpendicular to the bit lines, and a plurality of plate lines 66 to 69. One end of the bit lines 51 to 54 is connected to a Y-peripheral circuit 42. One end of each at the word lines 61 to 64 and the plate lines 66 to 69 is connected to an X-peripheral circuit 41. The x-peripheral circuit 41 and the Y-peripheral circuit 42 are respectively comprised of a decoder circuit, a driver circuit, On/Off switches, and the like. In the regions where each of the bit lines 51 to 54 intersects with each of the word lines 61 to 64 and the plate lines 66 to 69, basic cells 43 are disposed. FIG. 4 shows an example of the semiconductor apparatus in which basic cells 43 are disposed in a 4-by-4 array. The basic cells 43 are respectively provided with three connection points, where each connection point is connected to a bit line, a word line, and a plate line, respectively. For example, the basic cell encircled by a broken line in FIG. 4 is connected to the bit line 52, the word line 62, and the plate line 67:

One example of the basic cell 43 is illustrated in FIG. 4b. In this example, the basic cell is comprised of a field-effect transistor 47b, and a ferroelectric capacitor 48b which is connected in series with the field-effect transistor 47b. The other terminal of the ferroelectric capacitor 48b is connected to the plate line 46b. The other terminal of the field-effect transistor 47b is connected to the bit line 44b, and the gate electrode of the field-effect transistor 47b is connected to the word line 45b. The field-effect transistor 47b is a selection transistor, for which the thin film transistor described in Exemplary embodiment 1 or 2 according to the present invention is used. Through the action of the field-effect transistor 47b, a predetermined ferroelectric capacitor 48b is selected in the two-dimensional array. The selected ferroelectric capacitor 48b is applied with a specified voltage determined by the potential difference between the bit line 44b and the plate line 46b, and functions as a ferroelectric RAM. As described in Exemplary embodiment 1 or 2, since the semiconductor apparatus of the present invention can be fabricated on a plastic substrate by use of a printing method, it is possible to produce a large-area ferroelectric RAM at low cost. Moreover, since the semiconductor element according to the present invention can reduce the parasitic resistance in the current path, it is possible to reduce the voltage drop which takes place in the selection transistor 47b. Thereby the operational margin of the ferroelectric RAM increases and the operational stability thereof is improved.

A second example of the basic cell 43 is shown in FIG. 4c. In this example, the basic cell is comprised of a field-effect transistor 47c, and an electrophoretic microcapsule 48c, which is a so-called electronic ink, connected in series with the field-effect transistor 47c. The other terminal of the electrophoretic microcapsule 48c is connected to the plate line 46c. The other end of the field-effect transistor 47c is connected to the bit line 44c, and the gate electrode of the field-effect transistor 47c is connected to the word line 45c. The field-effect transistor 47c is a selection transistor, for which a thin film transistor according to Exemplary embodiment 1 or 2 of the present invention is used. Through the action of the field-effect transistor 47c, a predetermined electrophoretic microcapsule 48c is selected in the two-dimensional array. The selected electrophoretic microcapsule 48c is applied with a specified voltage which is determined by the potential difference between the bit line 44c and the plate line 46c, thereby allowing the display condition of the electrophoretic microcapsule 48c to be changed. Since, as described in Exemplary embodiment 1 or 2, the semiconductor apparatus of the present invention can be fabricated on a plastic substrate by a printing method, it is possible to manufacture a large-area, flexible display apparatus at low cost. Moreover, since the semiconductor element of the present invention can reduce the parasitic resistance in the current path, it is possible to reduce the voltage drop which takes place in the selection transistor 47c. Therefore, it is possible to improve the operational margin of the display apparatus and reduce the power consumption at the time of switching between displays.

A third example of the basic cell 43 is shown in FIG. 4d. In this example, the basic cell is comprised of a field-effect transistor 47d, and a variable resistance 48d connected in series with the field-effect transistor 47d. The other terminal of the variable resistance 48d is connected to the ground. The other terminal of the field-effect transistor 47d is connected to the bit line 44d, and the gate electrode of the field-effect transistor 47d is connected to the word line 45d. The field-effect transistor 47d is a selection transistor, for which a thin film transistor described in Exemplary embodiment 1 or 2 according to the present invention is used. Through the action of the field-effect transistor 47d, a predetermined variable resistance 48d is selected in the two-dimensional array. It is configured such that a constant current or a constant voltage is applied to the selected variable resistance 48d from the X-peripheral circuit 41 (FIG. 4) through the bit line 44d and the field-effect transistor 47*d* so that the resistance value of the variable resistance 48*d* can be detected. As the variable resistance 48*d*, a resistor whose resistance value varies depending on a magnetic field or pressure may be used. That is, the semiconductor apparatus of the present exemplary embodiment is a sensor array which can investigate the two-dimensional distribution of magnetic field or, pressure. Since, as so far described in Exemplary embodiment 1 or 2, the semiconductor apparatus of the present invention can be fabricated on a plastic substrate by a printing method, it is possible to manufacture a large-area, flexible sensor array at low cost. Further, since the semiconductor apparatus according to the present invention can reduce the resistance which occurs in the selection transistor 47*d* in a current path, high-accuracy sensing becomes possible.

As in FIG. 4*d* described above, for an element of which one end is connected to the ground, such as the variable resistance 48*d*, the selection switch in the basic cell can be replaced with a diode. One example is shown in FIG. 4*e*. The basic cell is comprised of a diode 47*e* connected to the bit line 44*e*, and a variable resistance 48*e* connected in series with the diode 47*e*. The other end of the variable resistance 48*ed* is connected to the word line 45*e*. For the above-described diode 47*e*, a Schottky diode described in Exemplary embodiment 3 according to the present invention is used. Since the semiconductor apparatus of the present invention can be fabricated on a plastic substrate by a printing method, it is possible to produce a large-area, flexible sensor array at low cost. Further, since the basic cell in FIG. 4*e* has no ground contact, the circuit of the cell becomes simplified, which is more suitable for forming a high density array, compared with the basic cell of FIG. 4*d*.

Although, examples of the present invention has been described so far, the examples described above can be modified in various ways based on the technological concept of the present invention.

Although, the present invention has been described so far with reference to exemplary embodiments and examples, the present invention will not be limited to the above-described exemplary embodiments and examples. Various modifications, which are understandable for a person skilled in the art, can be made to the configuration and details of the present invention within the scope of the present invention.

The invention claimed is:

1. A semiconductor element, comprising:
   a current path which comprises a plurality of carbon nanotubes and which has a semiconductive property; and
   two electrodes which are in contact with the current path, wherein
   at least one of the electrodes is made of a mixture of a metal and a carbon material having $SP^2$ hybridized orbital.

2. A semiconductor element, comprising:
   a current path which comprises a plurality of carbon nanotubes and which has a semiconductive property; and
   two electrodes which are in contact with the current path, wherein
   at least one of the electrodes is made of a mixture of a metal, a carbon material having $SP^2$ hybridized orbital, and a resin.

3. The semiconductor element according to claim 1, wherein
   the carbon material comprises at least one of a multi-walled carbon nanotube, a carbon nanohorn, a graphene, a glassy carbon, a graphite, and a fullerene.

4. The semiconductor element according to claim 1, wherein
   the metal comprises at least one element of gold, platinum, iridium, palladium, cobalt, and nickel.

5. The semiconductor element according to claim 1, wherein
   the metal comprises at least one element of silver, aluminum, titanium, tantalum, chromium, and tungsten.

6. The semiconductor element according to claim 1, wherein
   the current path is formed by a coating or printing process of a carbon nanotube dispersion and a drying process of the coated or printed dispersion.

7. The semiconductor element according to claim 1, wherein
   the electrode is formed by a coating or printing process, and a drying and sintering processes.

8. A semiconductor apparatus, wherein
   a plurality of the semiconductor elements according to claim 1 are formed on a substrate.

9. The semiconductor apparatus according to claim 8, wherein
   the substrate is a resin or a resin film laminated into multiple layers.

10. The semiconductor element according to claim 2, wherein
    the carbon material comprises at least one of a multi-walled carbon nanotube, a carbon nanohorn, a graphene, a glassy carbon, a graphite, and a fullerene.

11. The semiconductor element according to claim 2, wherein
    the metal comprises at least one element of gold, platinum, iridium, palladium, cobalt, and nickel.

12. The semiconductor element according to claim 2, wherein
    the metal comprises at least one element of silver, aluminum, titanium, tantalum, chromium, and tungsten.

13. The semiconductor element according to claim 2, wherein
    the current path is formed by a coating or printing process of a carbon nanotube dispersion and a drying process of the coated or printed dispersion.

14. The semiconductor element according to claim 2, wherein
    the electrode is formed by a coating or printing process, and a drying and sintering processes.

15. A semiconductor apparatus, wherein
    a plurality of the semiconductor elements according to claim 2 are formed on a substrate.

16. The semiconductor apparatus according to claim 15, wherein
    the substrate is a resin or a resin film laminated into multiple layers.

17. The semiconductor element according to claim 1, wherein the semiconductor element is a thin film transistor.

18. The semiconductor element according to claim 2, wherein the semiconductor element is a thin film transistor.

* * * * *